(12) United States Patent
Kotani

(10) Patent No.: US 6,638,799 B2
(45) Date of Patent: Oct. 28, 2003

(54) METHOD FOR MANUFACTURING A SEMICONDUCTOR DEVICE HAVING A SILICON ON INSULATOR SUBSTRATE

(75) Inventor: Naoki Kotani, Hyogo (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/011,705

(22) Filed: Dec. 11, 2001

(65) Prior Publication Data
US 2002/0106844 A1 Aug. 8, 2002

(30) Foreign Application Priority Data
Feb. 7, 2001 (JP) ........................................ 2001-030625

(51) Int. Cl.[7] .......................... H01L 21/00; H01L 21/84
(52) U.S. Cl. ........................................ 438/154; 438/151
(58) Field of Search ................................. 438/151, 154, 438/149, 162, 166, 279, 288, 289; 257/190, 192, 196, 59, 72, 344–353

(56) References Cited

U.S. PATENT DOCUMENTS

| | | | | |
|---|---|---|---|---|
| 4,769,686 A | * | 9/1988 | Horiuchi et al. | 257/384 |
| 4,891,326 A | * | 1/1990 | Koyanagi | 438/228 |
| 4,921,811 A | * | 5/1990 | Watanabe et al. | 438/226 |
| 5,124,272 A | * | 6/1992 | Saito et al. | 438/297 |
| 5,773,340 A | * | 6/1998 | Kumauchi et al. | 438/234 |
| 6,051,452 A | * | 4/2000 | Shigyo et al. | 438/151 |
| 6,287,903 B1 | * | 9/2001 | Okuno et al. | 438/142 |

FOREIGN PATENT DOCUMENTS

| | | | | |
|---|---|---|---|---|
| FR | 2782044 A1 | * | 2/2000 | B60T/13/57 |
| JP | 08318846 A | * | 12/1996 | B60T/13/57 |

* cited by examiner

Primary Examiner—Ernest Karlsen
Assistant Examiner—Jermele Hollington
(74) Attorney, Agent, or Firm—Nixon Peabody LLP; Donald R. Studebaker (57) ABSTRACT

In a method for manufacturing a MIS type SOI device, when an ion-implantation is carried out to form pocket regions of an n-type MISFET, an ion-implantation mask having a mask opening and covering a body contact region of a p-type MISFET is applied, and when an ion-implantation is carried out to form pocket regions of a p-type MISFET, an ion-implantation mask having a mask opening and covering a body contact region of an n-type MISFET is applied. By preventing the impurities of the conductivity type opposite to that of the body contact region from being introduced into the pathway portion, the body electrical potential can be securely fixed.

3 Claims, 8 Drawing Sheets

METHOD FOR MANUFACTURING A SEMICONDUCTOR DEVICE HAVING A SILICON ON INSULATOR SUBSTRATE

BACKGROUND OF THE INVENTION

The present invention relates to a method for manufacturing a semiconductor device that employs an SOI (Silicon On Insulator) substrate, more particularly, to a method for manufacturing a semiconductor device that enhances the capability of an SOI device in fixing the electrical potential of an SOI layer more securely.

In recent years, a semiconductor device in which such elements as transistors are integrated and is used within electronic equipment has been strongly demanded to operate in higher speed and lower power consumption. In order to meet such strong demand, advanced technologies have been developed and the refinement and the reduction in parasitic capacitance of a semiconductor device have been thereby considered effective.

Note that the refinement of a semiconductor device means mainly the reduction in gate length of a MOS transistor. However, the shorter the gate length is, the further enhanced the short channel effect of a MOS transistor is. To prevent the enhancement of short channel effect, the following technology for forming the so-called pocket region has been conceived. That is, impurity ions of the conductivity type opposite to that of the conductivity type of a source/drain region are implanted into the regions located inside the source/drain regions at a tilt angle of 45 degrees with respect to a direction perpendicular to the principal surface of a semiconductor substrate.

In addition, as one of measures to reduce the parasitic capacitance of a semiconductor device, an SOI device has been conceived so that a semiconductor layer is formed on an insulating substrate and then a semiconductor device such as a transistor is formed in the semiconductor layer. However, there also has been found many difficult problems that were not solved by the conventional technology being fostered in the semiconductor device development employing a bulk semiconductor substrate.

Figure 7:
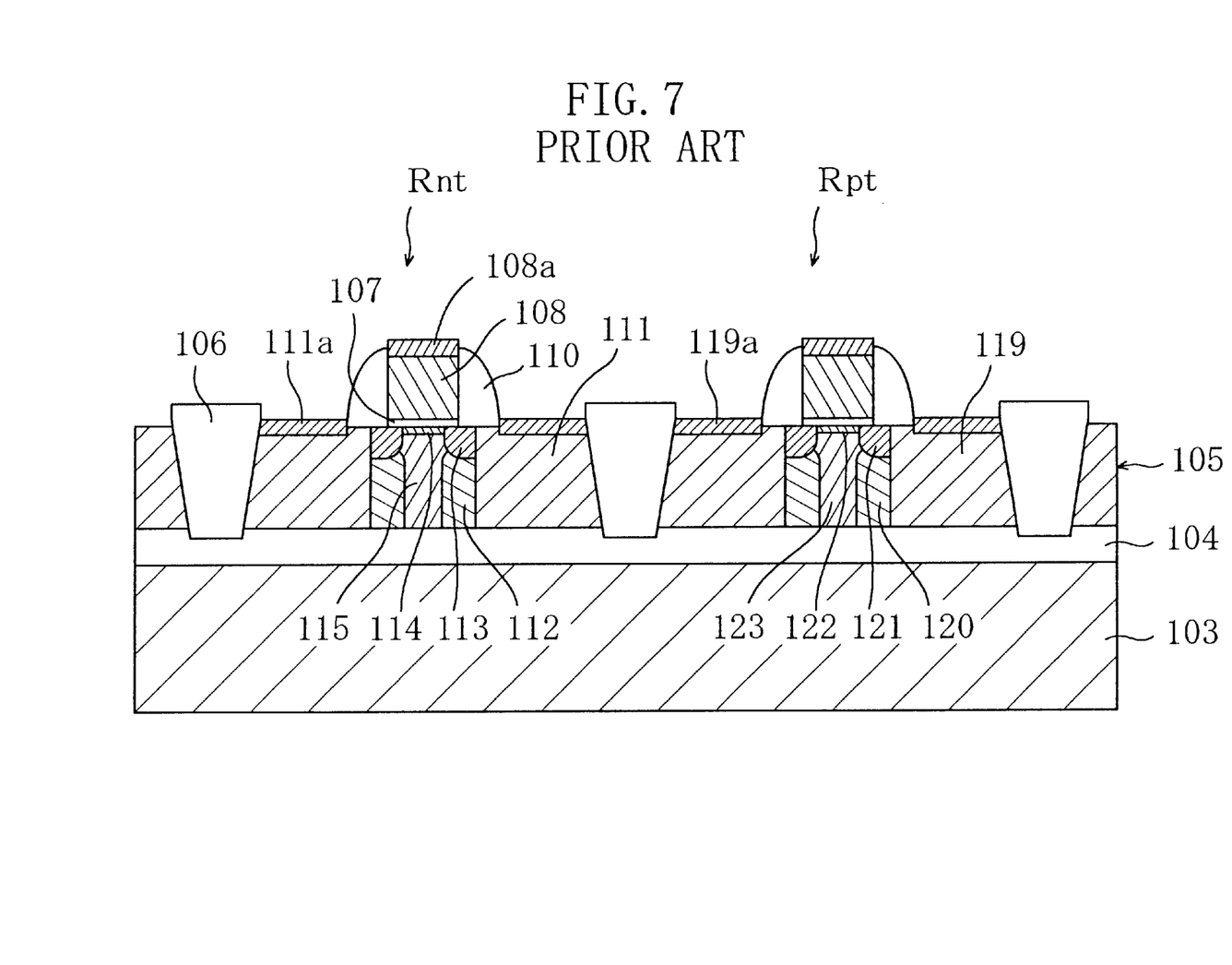
FIG. 7 is a cross sectional view of a conventional SOI device taken along a line drawn in a channel direction (gate length direction).

A conventional SOI device consisting of CMOS transistor with a pocket region will be described below. FIG. 7 is a cross sectional view of a conventional SOI device taken along a line in a channel direction (gate length direction).

As shown in FIG. 7, the CMOS type conventional SOI device comprises a silicon substrate 103, a BOX (Buried Oxide) layer 104 formed in a region having a certain depth below the principal surface of the silicon substrate 103, an oxide film 106 for element isolation formed as an STI (Shallow Trench Isolation) to separate a semiconductor layer 105 located on the BOX layer 104 into an n-type MISFET formation region denoted by Rnt and a p-type MISFET formation region denoted by Rpt, a gate insulating film 107 of a silicon oxide film formed on the semiconductor layer 105, a gate electrode 108 formed on the gate insulating film 107, a silicide layer 108a formed in the upper portions of the gate electrode 108, and sidewalls 110 of a silicon oxide film formed on the side surfaces of the gate electrode 108.

Furthermore, an n-type MISFET comprises, within the semiconductor layer 105, n-type source/drain regions 111 formed in both regions beside the gate electrode 108, silicide layers 111a formed in the upper portions of the n-type source/drain regions 111, n-type LDD regions 113 formed inside the n-type source/drain regions 111, p-type pocket regions 112 formed under the n-type LDD regions 113 and located inside the n-type source/drain regions 111, a channel control region 114 including p-type impurities and formed just below the gate insulating film 107, being interposed between the n-type LDD regions 113, and a p-type well region 115 formed under the channel control region 114 so as to extend downward therefrom.

A p-type MISFET comprises, within the semiconductor layer 105, p-type source/drain regions 119 formed in both regions beside the gate electrode 108, silicide layers 119a formed in the upper portions of the p-type source/drain regions 119, p-type LDD regions 121 formed inside the p-type source/drain regions 119, n-type pocket regions 120 formed under the p-type LDD regions 121 and located inside the p-type source/drain regions 119, a channel control region 122 including n-type impurities and formed just below the gate insulating film 107, being interposed between the p-type LDD regions 121, and an n-type well region 123 formed under the channel control region 122 so as to extend downward therefrom.

It should be noted that in the n-type MISFET formation region, Rnt, as the p-type pocket region 112 is formed under the n-type LDD region 113 doped with impurities at a low concentration, the pocket region suppresses the spread of the depletion layer of the LDD region 113 in the p-type well region 115, whereby the short channel effect generated in the n-type MISFET is suppressed.

In the same manner as in the n-type MISFET, in the p-type MISFET formation region, Rpt, as the n-type pocket region 120 is formed under the p-type LDD region 121 doped with impurities at a low concentration, the pocket region suppresses the spread of the depletion layer of the LDD region 121 in the n-type well region 123, whereby the short channel effect generated in the p-type MISFET is suppressed.

However, in the SOI device as above, each of the MISFET formation regions is isolated from each other by the BOX layer 104 and the oxide film 106 for element isolation formed as an STI. Owing to the specific structure of the SOI device described above, the electrical potential of the body regions right under the channel control region 114 of the n-type MISFET and that of the body regions right under the channel control region 122 of the p-type MISFET cannot be fixed via respective well regions 115 and 123, whereas the electrical potential of a body region in a bulk silicon device employing a bulk silicon substrate is fixed. To prevent such phenomenon, in general, a body contact region shown in the following explanation is formed to fix the electrical potential of a body region.

Figure 8A:
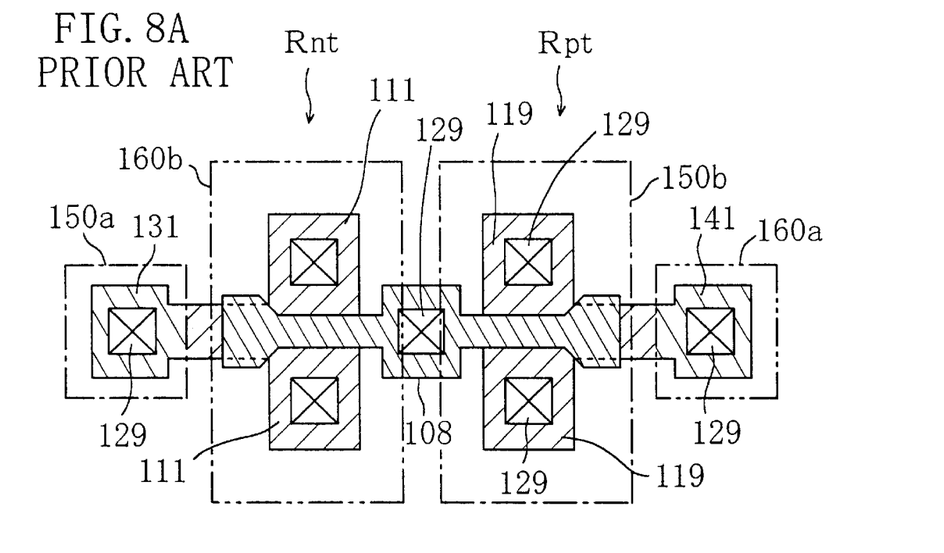
FIGS. 8A and 8B are respectively a plan view and a cross sectional view of a conventional CMOS type SOI device, the cross sectional view being taken along a line orthogonal to a channel direction.
Figure 8B:
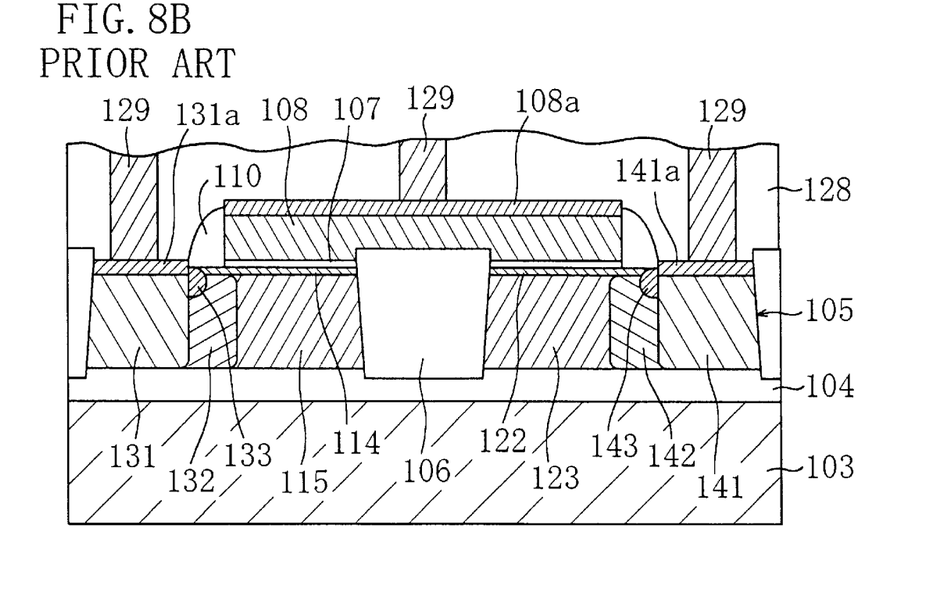

FIG. 8A is a plan view of a CMISFET that consists of the n-type MISFET and the p-type MISFET shown in FIG. 7, and simultaneously constitutes an inverter circuit. FIG. 8B is a cross sectional view of the CMISFET taken along a line orthogonal to a channel direction. However, note that in FIG. 8A sidewalls 110 are omitted for simplicity of illustration.

As shown in FIGS. 8A and 8B, a p-type body contact region 131 doped with p-type impurities at a high concentration and a silicide film 131a are formed in the n-type MISFET formation region, Rnt. This p-type body contact region 131 is formed to fix the electrical potential of the p-type well region 115 right under the channel control region 114 of the n-type MISFET and reduce substantially the resistance of the p-type well region. In addition, in the same manner as in the n-type MISFET, an n-type body contact region 141 doped with n-type impurities at a high concentration and a silicide film 141a are formed in the p-type MISFET formation region, Rpt. This n-type body contact region 141 is formed to fix the electrical potential of the n-type well region 123 right under the channel control region 122 of the p-type MISFET and reduce substantially the resistance of the n-type well region.

Furthermore, plugs 129 penetrating an interlayer insulating film 128 are formed therein reaching the surfaces of the gate electrode 108, the source/drain regions 111, 119 and the body contact regions 131, 141, whereby each of the above-stated portions are supplied with a voltage via the plugs 129. In more detail, the body contact regions 131 and 141 are connected to the well regions 115 and 123 respectively via the corresponding pathway portions, and thus by supplying a voltage to the plugs 129 that reach the surfaces of the body contact regions 131 and 141, the inverter circuit is configured to fix the electrical potential of the well regions 115 and 123 just below the channel control regions 114 and 122, respectively.

However, in the above-described conventional SOI device, there has been seen a problem that even when a voltage is applied to the respective body contact regions 131 and 141 via the corresponding plugs 129 in the n-type MISFET and the p-type MISFET, the electrical potential of the well regions 115 and 123 just below the respective channel control regions 114 and 122 of the MISFETs is not securely being fixed.

So, the inventor investigated the cause of the problem and then obtained the result that the following phenomenon occurs in the inverter circuit of the conventional SOI device.

First, low concentration impurities are in advance being introduced into the well regions 115 and 123 of the respective MISFETs, thereby forming the n-type MISFET formation regions, Rnt, doped with p-type impurities at a low concentration and the p-type MISFET formation region, Rpt, doped with n-type impurities at a low concentration, respectively, within the semiconductor layer 105. Subsequently, impurity introduction for controlling a threshold voltage (channel doping method) is performed to form the channel control regions 114 and 122 in the respective MISFETs.

Thereafter, in the n-type MISFET formation region, Rnt, an impurity ion-implantation is carried out to form the p-type body contact region 131, simultaneously forming source/drain regions 119 of the p-type MISFET. That is, impurity ions are implanted through a first opening 150a (NW opening), indicated by the alternate long and short dash line in FIG. 8A, of an ion-implantation mask into the p-type body contact region 131 of the n-type MISFET, and the impurity ions are implanted through a second opening 150b (ND opening), indicated by the alternate long and short dash line, of the ion-implantation mask into the source/drain regions 119 of the p-type MISFET.

In the same manner, in the p-type MISFET formation region, Rpt, an impurity ion-implantation is carried out to form the n-type body contact region 141, simultaneously forming source/drain regions 111 of the n-type MISFET. That is, impurity ions are implanted through a first opening 160a (PW opening), indicated by the alternate long and two short dash line in FIG. 8A, of another ion-implantation mask into the n-type body contact region 141 of the p-type MISFET, and the impurity ions are implanted through a second opening 160b (PD opening), indicated by the alternate long and two short dash line, of the another ion-implantation mask into the source/drain regions 111 of the n-type MISFET.

At this stage where the above-stated processes are completed, in the n-type MISFET formation region, Rnt, the p-type body contact region 131 and the p-type well region 115 are considered to fundamentally be electrically connected to each other since both regions 131 and 115 have a common conductivity type. Similarly, in the p-type MISFET formation region, Rpt, the n-type body contact region 141 and the n-type well region 123 are considered to fundamentally be electrically connected to each other since both regions 141 and 123 have a common conductivity type. Therefore, it has been considered possible that the body electrical potential of the MISFETs is fixed by supplying a voltage to the body contact regions 131 and 141 via the respective plugs 129.

However, the above-stated consideration is not the case. The fact is as follows: in the conventional process for forming a CMISFET, the ion-implantation mask used for forming a source/drain region is also used to perform an impurity ion-implantation (pocket ion-implantation) to form a pocket region. Here, it should be noted the reason why such manufacturing method has been employed in the conventional manufacturing process for an SOI device is that, in order to lower the manufacturing cost, the number of photolithography steps has to be reduced as many as possible in the whole manufacturing process steps. When the n-type pocket region (the region 120 illustrated in FIG. 7) of the p-type MISFET is going to be formed, four-step ion-implantations (hereinafter, the words "four-step ion-implantations" are used for ion-implantations done from each of four sides of a wafer) of n-type impurity ions are carried out at a tilt angle of 45 degrees with respect to a direction perpendicular to the substrate surface.

As illustrated in FIG. 8B, when the above-stated pocket ion-implantation for the p-type MISFET is carried out in the n-type MISFET formation region, Rnt, the n-type impurities implanted through the first opening 150a are introduced into the pathway portion and thus an n-type region 132 is formed within the pathway portion that connects the p-type well region 115 and the p-type body contact region 131. The reason for the formation of the n-type region 132 is that although the concentration of the n-type impurities implanted in this ion-implantation step is lower than the p-type impurity concentration of the p-type body contact region 131, it is higher than the impurity concentration of the p-type well region 115. Here, it should be noted that the pocket ion-implantation to be done almost exclusively for forming the pocket regions of the p-type MISFET shown in FIG. 8A does not contribute to the formation of the n-type region 132 of the n-type MISFET formation region, Rnt, shown in FIG. 8B, but the pocket ion-implantation to be done almost exclusively for forming pocket regions of other p-type MISFETs, each having a gate electrode orthogonal to the gate electrode 108 shown in FIG. 8A, contributes to the formation of the n-type region 132 shown in FIG. 8B.

For the similar reason explained in the case of the formation of the n-type region 132, when the pocket ion-implantation for the n-type MISFET is carried out, the p-type impurities implanted through the first opening 160a are introduced into the pathway portion and thus a p-type region 142 is formed within the pathway portion that connects the n-type well region 123 and the n-type body contact region 141.

Consequently, it is considered that the regions, each having the conductivity type opposite to that of the corresponding body contact regions 131 and 141, are formed within the respective pathway portions that connect the body contact regions 131, 141 and the well regions 115, 123, respectively, and as a result, the regions become to lie between the body contact regions 131, 141 and the well regions 115, 123, respectively, whereby the body electrical potential of the MISFETs is not fixed securely.

Furthermore, when an ion-implantation is carried out to form the p-type LDD regions of the p-type MISFET, a low concentration p-type region 143 is simultaneously formed in the upper portion of the pathway portion that connects the n-type body contact region 141 and the n-type well region 123. Similarly, when an ion-implantation is carried out to form the n-type LDD regions of the n-type MISFET, a low concentration n-type region 133 is simultaneously formed in the upper portion of the pathway portion that connects the p-type body contact region 131 and the p-type well region 115. By these configurations of the MISFETs, the conventional SOI device is in danger of lowering its capability of fixing the body electrical potential of the MISFETs since the resistance of the pathway portions increases in accordance with the narrowed width of the pathway portions.

SUMMARY OF THE INVENTION

It is an object of the present invention to provide a manufacturing method for preventing impurity ions of the conductivity type opposite to that of a body contact region from being implanted into a pathway portion that connects the well region and the body contact region of a MISFET formation region, whereby an SOI device becomes to have high capability of fixing a body electrical potential while responding to the requirement for further refinement of an SOI device.

Before describing a method for manufacturing a semiconductor device of the present invention, the semiconductor device manufactured by this method is assumed to have a configuration as follows: a semiconductor device comprising:

a first MISFET having:
 a gate electrode formed on a semiconductor layer of an SOI substrate;
 source/drain regions of a first conductivity type formed in both regions beside the gate electrode in the semiconductor layer;
 a well region of a second conductivity type formed below the gate electrode in the semiconductor layer;
 pocket regions doped with impurities of the second conductivity type at a higher concentration than that of the well region and formed between the well region and the source/drain regions in the semiconductor layer;
 a body contact region doped with impurities of the second conductivity type at a higher concentration than that of the well region and connected to the well region;
 a pathway portion doped with impurities of the second conductivity type and connecting the well region and the body contact region;
a second MISFET having:
 the gate electrode formed on the semiconductor layer of the SOI substrate;
 source/drain regions of the second conductivity type formed in both regions beside the gate electrode in the semiconductor layer;
 a well region of the first conductivity type formed below the gate electrode in the semiconductor layer;
 pocket regions doped with impurities of the first conductivity type at a higher concentration than that of the well region and formed between the well region and the source/drain regions in the semiconductor layer;
 a body contact region doped with impurities of the first conductivity type at a higher concentration than that of the well region and connected to the well region;
 a pathway portion doped with impurities of the first conductivity type and connecting the well region and the body contact region.

Subsequently, the method for manufacturing the above-described semiconductor device comprises a pocket ion-implantation step for implanting impurity ions of the second conductivity type into the pocket regions of the first MISFET by using a first ion-implantation mask covering the body contact region of the second MISFET, and implanting impurity ions of the first conductivity type into the pocket region of the second MISFET by using a second ion-implantation mask covering the body contact region of the first MISFET.

By applying this method, the impurities of the first conductivity type to be implanted for forming the pocket regions of the second MISFET is never introduced into the pathway portion that connects the body contact region and the well region of the first MISFET, and further the impurities of the first conductivity type to be implanted for forming the pocket region of the first MISFET is never introduced into the pathway portion that connects the body contact region and the well region of the second MISFET. Therefore, the body electrical potential can be securely fixed since the impurities of the same conductivity type are doped thoroughly from the body contact region to the well region in the first and second MISFETs, respectively.

The above-described semiconductor device may have a further configuration as follows:
 the gate electrode extends to cover halfway portions of the pathway portions of the corresponding well regions;
 within the semiconductor layer, each of the first and second MISFETs further comprises second source/drain regions doped with impurities of the same conductivity type as the source/drain regions at a lower concentration than that of the source/drain regions and being adjacent to the respective source/drain regions on sides near the gate electrode.

Under the above-described configuration, when the first and second ion-implantation masks are also applied for implanting impurity ions to form the respective second source/drain regions, the first and second ion-implantation masks may cover a part of the respective pathway portions of the well regions, the part being not covered by the gate electrode. This prevents impurities of the conductivity type opposite to that of the pathway portion to be ion-implanted for forming the second source/drain regions in the respective MISFETs from being introduced into the pathway portions of the respective MISFETs, whereby the phenomenon that the capability of the inverter circuit in fixing the electrical potential of the body degrades can be prevented.

The method for manufacturing the semiconductor device is still further configured as follows. That is, when impurity ions of the second conductivity type are implanted into the body contact region of the first MISFET, a third ion-implantation mask covering an adjacent part of the body contact region to the pathway portion may be applied, and when impurity ions of the first conductivity type are implanted into the body contact region of the second MISFET, a fourth ion-implantation mask covering an adjacent part of the body contact region to the pathway portion may be applied. Thereby the length of the pathway portions can be made as short as possible and thus the finer pattern of a semiconductor device can be achieved.

DETAILED DESCRIPTION OF THE INVENTION

Figure 1:
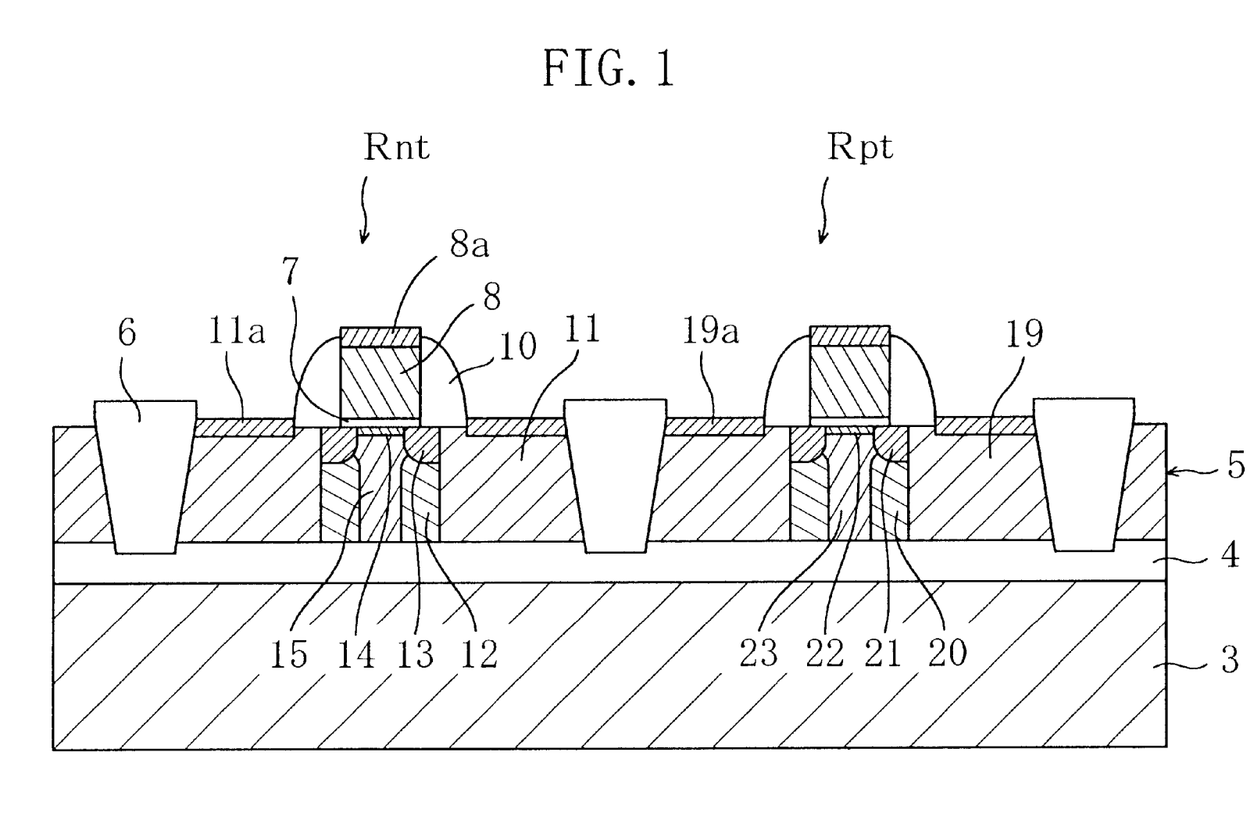
FIG. 1 is a cross sectional view of an SOI device according to an embodiment of the present invention taken along a line drawn in a channel direction (gate length direction).

FIG. 1 is a cross sectional view of an SOI device related to an embodiment of the present invention taken along a line drawn in a channel direction (gate length direction).

As shown in FIG. 1, a CMOS type SOI device of this embodiment comprises a silicon substrate 3, a BOX (Buried Oxide) layer 4 formed in a region having a certain depth below the principal surface of the silicon substrate 3, an oxide film 6 for element isolation formed as an STI (Shallow Trench Isolation) to separate a semiconductor layer 5 located above the BOX layer 4 into an n-type MISFET formation region denoted by Rnt and a p-type MISFET formation region denoted by Rpt, a gate insulating film 7 of a silicon oxide film formed on the semiconductor layer 5, a gate electrode 8 formed on the gate insulating film 7, a silicide layer 8a formed in the upper portion of the gate electrode 8, and sidewalls 10 of a silicon oxide film formed on the side surfaces of the gate electrode 8.

Furthermore, an n-type MISFET comprises, within the semiconductor layer 5, n-type source/drain regions 11 formed in the both regions beside the gate electrode 8, silicide layers 11a formed in the upper portions of the n-type source/drain regions 11, n-type LDD regions 13 formed inside the n-type source/drain regions 11, p-type pocket regions 12 formed under the n-type LDD regions 13 and located inside the n-type source/drain regions 11, a channel control region 14 including p-type impurities and formed just below the gate insulating film 7, simultaneously being interposed between the n-type LDD regions 13, and a p-type well region 15 formed below the channel control region 14 so as to extend downward therefrom.

Similarly, a p-type MISFET comprises, within the semiconductor layer 5, p-type source/drain regions 19 formed in the both regions beside the gate electrode 8, suicide layers 19a formed in the upper portions of the p-type source/drain regions 19, p-type LDD regions 21 formed inside the p-type source/drain regions 19, n-type pocket regions 20 formed under the p-type LDD regions 21 and located inside the p-type source/drain regions 19, a channel control region 22 including n-type impurities and formed just below the gate insulating film 7, simultaneously being interposed between the p-type LDD regions 21, and an n-type well region 23 formed below the channel control region 22 so as to extend downward therefrom.

It should be noted that as the p-type pocket region 12 is formed under the n-type LDD region 13 doped with impurities at a low concentration in the n-type MISFET formation region, Rnt, the pocket region suppresses the spread of the depletion layer of the n-type LDD region 13, whereby the short channel effect generated in the n-type MISFET is suppressed.

In the same manner as in the n-type MISFET, as the n-type pocket region 20 is formed under the p-type LDD region 21 doped with impurities at a low concentration in the p-type MISFET formation region, Rpt, the pocket region suppresses the spread of the depletion layer of the p-type LDD region 21, whereby the short channel effect generated in the p-type MISFET is suppressed.

Moreover, in the SOI device of this embodiment, the BOX layer 4 electrically isolates the semiconductor layer 5 from the underlying silicon substrate 3 and thus the parasitic capacitance between the semiconductor layer 5 and the silicon substrate 3, which delays the current flow speed, is reduced to a great extent, whereby the high speed operation of a MISFET can be achieved.

To solve the problem seen in the conventional SOI device that the region of the conductivity type opposite to that of the body contact region is formed within the body contact region, this embodiment employs the following manufacturing process steps.

FIGS. 2A, 2B through FIGS. 6A, 6B are plan views and sectional views, respectively, and illustrate a part of the manufacturing process steps for the SOI device of this embodiment. In more detail, FIGS. 2A, 2B through FIGS. 6A, 6B are plan views and sectional views, each sectional view being taken along a line orthogonal to a channel direction of a CMISFET that consists of the n-type MISFET and the p-type MISFET shown in FIG. 1, and simultaneously constitutes an inverter circuit. However, note that in FIGS. 5A and 6A, sidewalls 10 are omitted for simplicity of illustration.

First, in the manufacturing step shown in FIGS. 2A and 2B, by using the so-called SIMOX method, oxygen ions ($O^+$) are implanted into a region having a certain depth below the principal surface of the silicon substrate 3 followed by a heat treatment and thus a BOX layer 4 is formed in the silicon substrate 3. The BOX layer 4 electrically isolates the semiconductor layer 5 formed in the surface portion of the silicon substrate 3 from the lower portion of the silicon substrate 3 that constitutes the mother structure for the semiconductor layer. Then, a protective oxide film is formed on the semiconductor layer 5 and an oxide film 6 for element isolation having an STI structure is formed. The element isolation oxide film 6 separates the semiconductor layer 5 into an n-type MISFET formation region, Rnt, and a p-type MISFET formation region, Rpt. At this stage, the n-type MISFET formation region, Rnt, consists of an active region 5a of a wide width dimension, which will accommodate such element regions as a source/drain region and a channel region, and a pathway portion 5b of a narrow width dimension led from the active region 5a, and a contact region 5c of a relatively wide width dimension located at the edge of the pathway portion 5b, in which a body contact region will be formed later. Similarly, the p-type MISFET formation region, Rpt, consists of an active region 5d of a wide width dimension, which will accommodate such element regions as a source/drain region and a channel region, and a pathway portion 5e of a narrow width dimension led out from the active region 5d, and a contact region 5f of a relatively wide width dimension located at the edge of the pathway portion 5e, in which a body contact region will be formed later.

Thereafter, well ion-implantations are carried out to form respective well regions in the n-type MISFET formation region, Rnt, and the p-type MISFET formation region, Rpt. That is, as shown in FIG. 2A, by using an ion-implantation mask having a mask opening 50 that exposes the whole area of the n-type MISFET formation region, Rnt, p-type impurity ions (for example, boron fluoride ions) are implanted into the n-type MISFET formation region, Rnt, to form a p-type well region 15 under the following conditions: acceleration energy: 60 keV; dose: $6.5 \times 10^{12}$ atoms/cm$^2$. Subsequently, p-type impurity ions (for example, boron fluoride ions) are implanted into the same region (Rnt) to form a shallow channel control region 14 in the upper portion of the p-type well region 15 under the following low energy ion-implantation conditions: acceleration energy: 30 keV; dose: $1.1 \times 10^{13}$ atoms/cm$^2$.

Figure 2A:
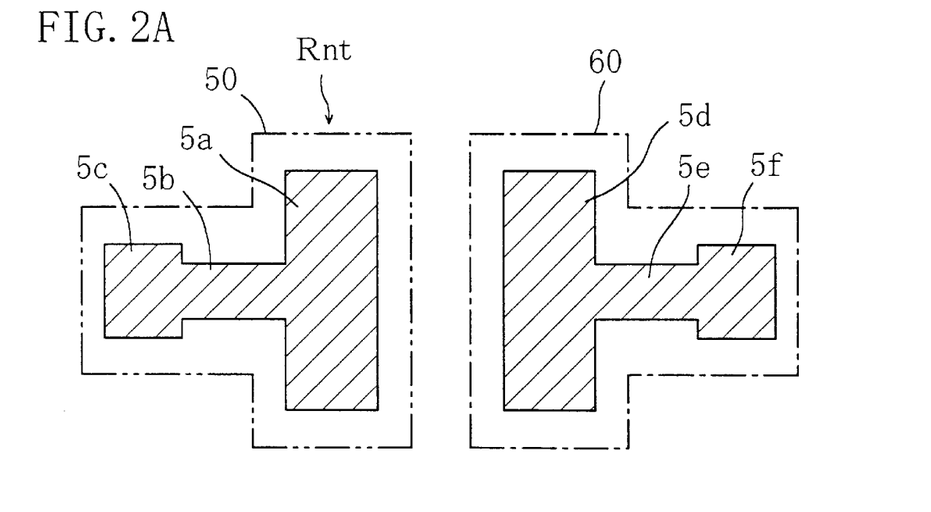
FIGS. 2A and 2B are a plan view and a cross sectional view, respectively, illustrating a well ion-implantation step out of the whole process steps for manufacturing an SOI device according to the present invention.
Figure 2B:
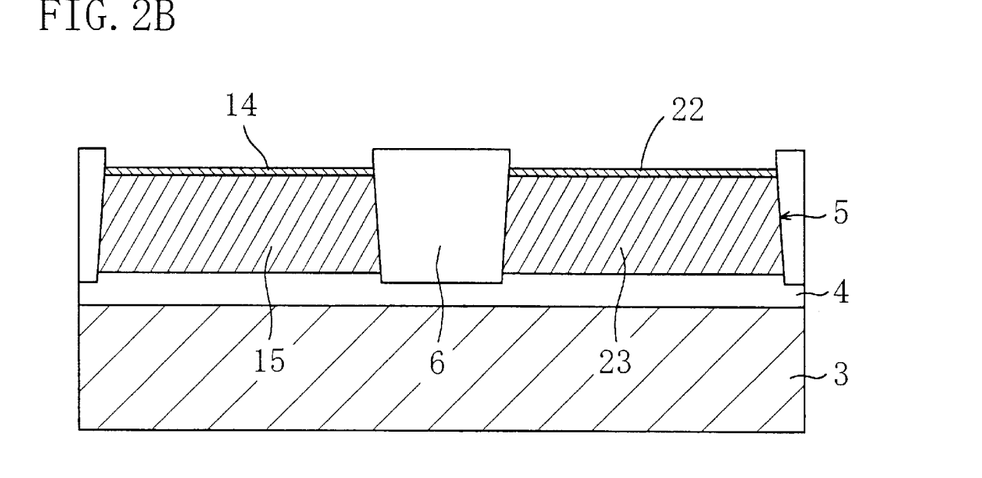

Furthermore, as shown in FIG. 2A, by using an ion-implantation mask having a mask opening 60 that exposes the whole area of the p-type MISFET formation region, Rpt, n-type impurity ions (for example, phosphorous ions) are implanted into the p-type MISFET formation region, Rpt, to form an n-type well region 23 under the following conditions: acceleration energy: 80 keV; dose: $1.2 \times 10^{12}$ atoms/cm$^2$. Subsequently, n-type impurity ions (for example, phosphorous ions) are implanted into the same region (Rpt) to form a shallow channel control region 22 in the upper portion of the n-type well region 23 under the following low energy ion-implantation conditions: acceleration energy: 50 keV; dose: $6.0 \times 10^{12}$ atoms/cm$^2$.

Figure 3A:
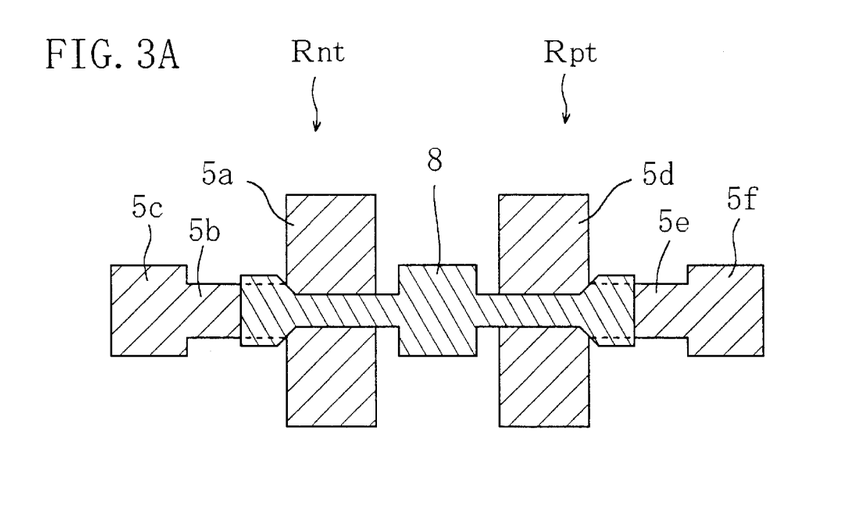
FIGS. 3A and 3B are a plan view and a cross sectional view, respectively, illustrating a gate electrode formation step out of the whole process steps for manufacturing an SOI device according to the present invention.
Figure 3B:
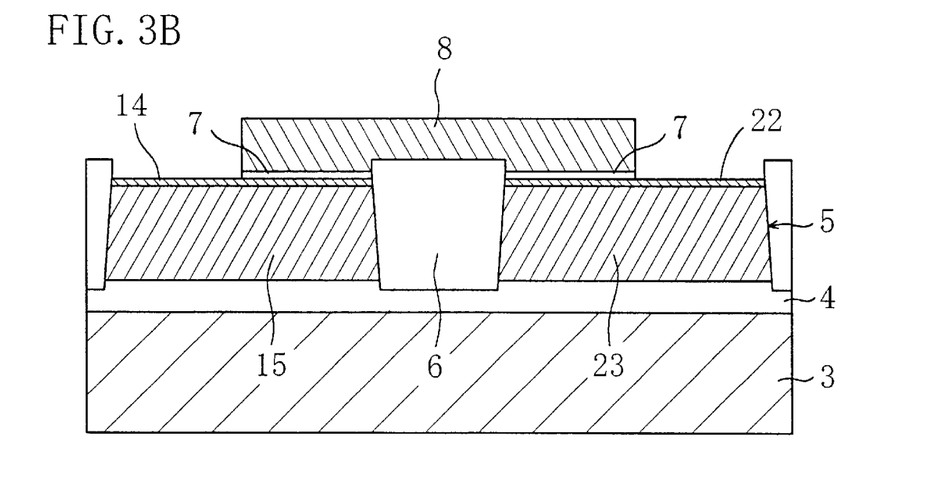

Thereafter, in the manufacturing step corresponding to FIGS. 3A and 3B, the protective oxide film on the semiconductor layer 5 is removed and then a silicon oxide film is formed on the channel control regions 14, 22 by a thermal oxidization method, and further a polysilicon film is deposited on the substrate. Subsequently, by applying a photolithography method and using a dry etching method, the polysilicon film and the silicon oxide film thereunder are patterned to form a gate electrode 8 and a gate insulating film 7. At this stage, as shown in FIG. 3A, the gate electrode 8 has a pattern as follows: the gate electrode 8 has a contact portion located on the oxide film that is a part of the element isolation oxide film 6 and between the n-type MISFET formation region, Rnt, and the p-type MISFET formation region, Rpt; and extends from the contact portion, crossing over the active regions 5a, 5d of the semiconductor layer 5 approximately in a shape of straight line; and after the straight line-shaped extension, further extends expanding its width dimension so as to cover approximately half of the pathway portions 5b, 5e.

Figure 4A:
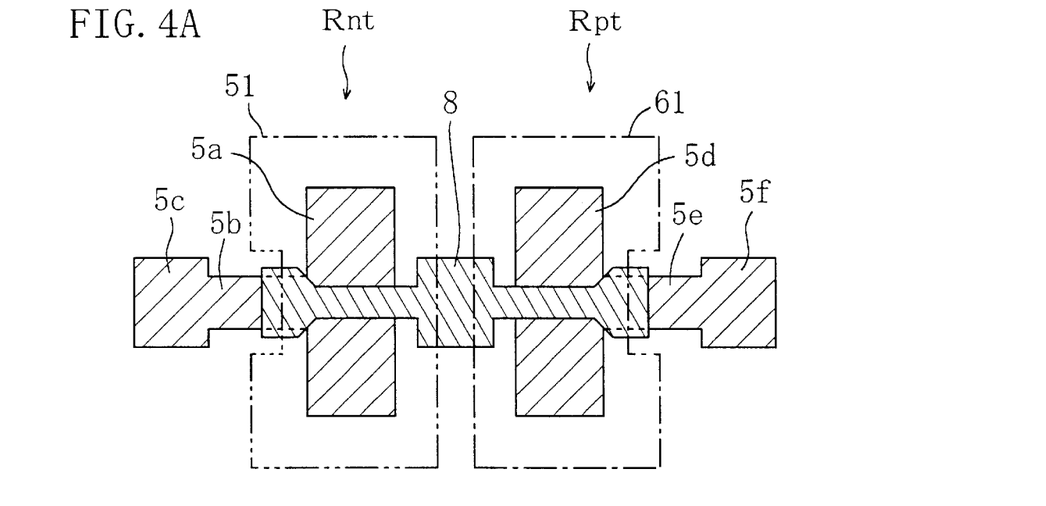
FIGS. 4A and 4B are a plan view and a cross sectional view, respectively, illustrating pocket ion-implantation and LDD ion-implantation steps out of the whole process steps for manufacturing an SOI device according to the present invention.
Figure 4B:
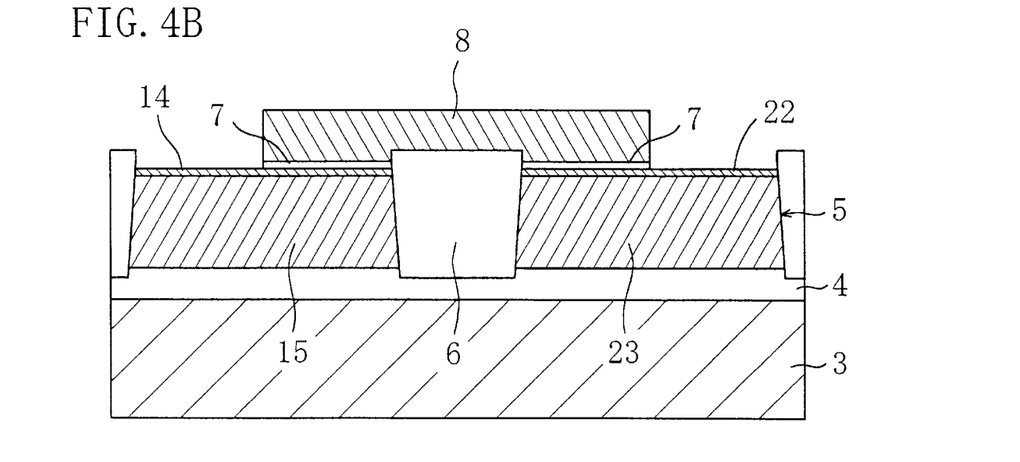

Thereafter, in the manufacturing step corresponding to FIGS. 4A and 4B, within the n-type MISFET formation region, by using an ion-implantation mask (NY mask) having a mask opening 51 that exposes the active region 5a and a part of the pathway portion 5b (the part is limited within the portion covered by the gate electrode 8), ion-implantations are carried out to form the n-type LDD regions 13 (refer to FIG. 1) and the pocket regions 12 (refer to FIG. 1) of the n-type MISFET. The ion-implantation mask (NY mask) used in this manufacturing step covers the contact region 5f of the p-type MISFET formation region, Rpt. In addition, the ion-implantation mask (NY mask) also covers the edge portion of a part of the gate electrode 8, the part being located on the pathway portion 5b of the n-type MISFET formation region, Rnt. In this case, the ion-implantation for forming the LDD regions is carried out under the following one-step ion-implantation (hereinafter, the words "one-step ion-implantation" are used for an ion-implantation done from only one side of a wafer) conditions: dopant ions: arsenic ions; acceleration energy: 10 keV; dose: $4.0 \times 10^{14}$ atoms/cm$^2$; tilt angle: about zero. The ion-implantation for forming the pocket regions is carried out under the following four-step ion-implantations conditions: dopant ions: boron fluoride ions; acceleration energy: 50 keV; dose $2.7 \times 10^{13}$ atoms/cm$^2$; tilt angle: 25 degrees.

It should be noted that as the ion-implantation mask (NY mask) covers the contact region 5f of the p-type MISFET formation region, Rpt, the region corresponding to the p-type region 142 shown in FIG. 8B is never formed within the pathway portion 5e. In addition, as the ion-implantation mask (NY mask) also covers the edge portion of a part of the gate electrode 8, the part being located on the pathway portion 5b of the n-type MISFET formation region, Rnt, the region corresponding to the n-type region 133 of a low impurity concentration shown in FIG. 8B is never formed within the pathway portion 5b.

After the above-described ion-implantation mask (NY mask) is removed, within the p-type MISFET formation region, Rpt, by using an ion-implantation mask (PY mask) having a mask opening 61 that exposes the active region 5d and a part of the pathway portion 5e (the part is limited within the region covered by the gate electrode 8), ion-implantations are carried out to form the p-type LDD region 21 (refer to FIG. 1) and the pocket region 20 (refer to FIG. 1) of the p-type MISFET. The ion-implantation mask (PY mask) used in this manufacturing step covers the contact region 5c of the n-type MISFET formation region, Rnt. In addition, the ion-implantation mask (PY mask) also covers the edge portion of a part of the gate electrode 8, the part being located on the pathway portion 5e of the p-type MISFET formation region, Rpt. In this case, the ion-implantation for forming the LDD regions is carried out under the following one-step ion-implantation conditions: dopant ions: boron fluoride ions; acceleration energy: 8 keV; dose: $8.0 \times 10^{13}$ atoms/cm$^2$; tilt angle: about zero. The ion-implantation for forming the pocket regions is carried out under the following four-step ion-implantations conditions: dopant ions: arsenic ions; acceleration energy: 140 keV; dose: $2.4 \times 10^{13}$ atoms/cm$^2$; tilt angle: 25 degrees.

It should be noted that as the ion-implantation mask (PY mask) covers the contact region 5c of the n-type MISFET formation region, Rnt, the region corresponding to the n-type region 132 shown in FIG. 8B is never formed within the pathway portion 5b. In addition, as the ion-implantation mask (PY mask) also covers the edge portion of a part of the gate electrode 8, the part being located on the pathway portion 5e of the p-type MISFET formation region, Rpt, the region corresponding to the p-type region 143 of a low impurity concentration shown in FIG. 8B is never formed within the pathway portion 5e.

Figure 5A:
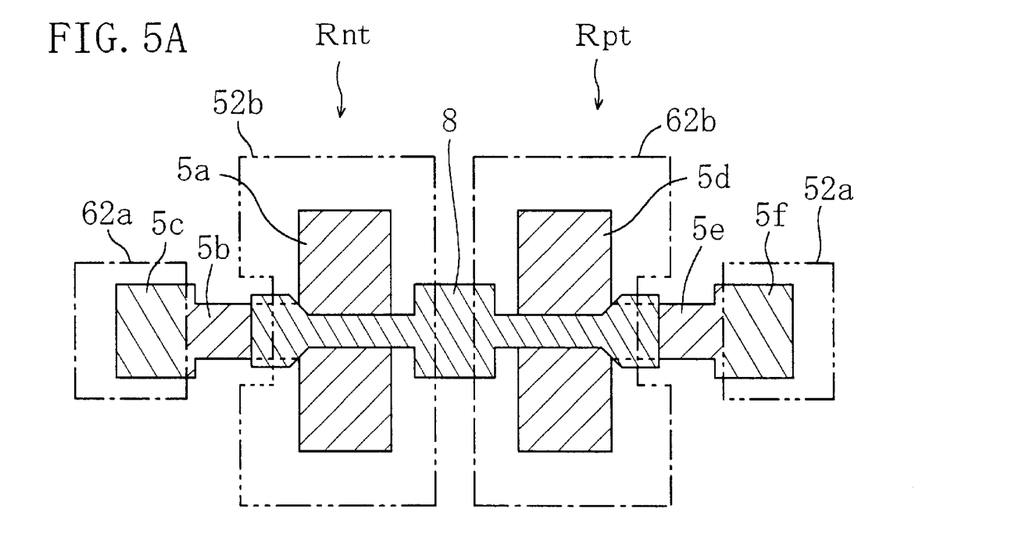
FIGS. 5A and 5B are a plan view and a cross sectional view, respectively, illustrating source/drain ion-implantation and body contact ion-implantation steps out of the whole process steps for manufacturing an SOI device according to the present invention.
Figure 5B:
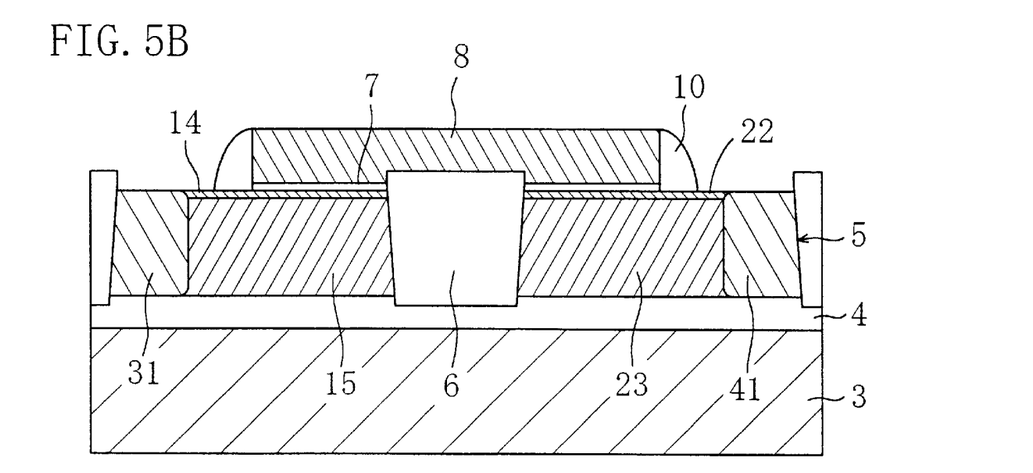

After removing the ion-implantation mask (PY mask), in the manufacturing step corresponding to FIGS. 5A and 5B, a silicon oxide film is deposited on the substrate and then the silicon oxide film is etched back to form sidewalls 10 on both side surfaces of the gate electrode 8.

Thereafter, an ion-implantation is carried out to form the source/drain regions 11 of the n-type MISFET (refer to FIG. 1) and the n-type body contact region 41 of the p-type MISFET formation region, Rpt, (refer to FIG. 5B) by using an ion-implantation mask (ND mask) having the following mask pattern. That is, the mask pattern has a first mask opening 52a so that a contact portion 5f excluding the area thereof adjacent to the pathway portion 5e is exposed and a second mask opening 52b so that the active region 5a and a part of the pathway portion 5b of the n-type MISFET formation region, Rnt, are exposed. Here, note that the first mask opening 52a of the ion-implantation mask (ND mask) used in this manufacturing step exposes most part of the contact portion 5f of the p-type MISFET formation region, Rpt, but the ion-implantation mask (ND mask) covers the pathway portion 5e and a part of the contact portion 5f connected thereto, the part being adjacent to the pathway portion 5e. In this case, the ion-implantation is carried out under the following one-step ion-implantation conditions: dopant ions: arsenic ions; acceleration energy: 50 keV; dose: $3 \times 10^{15}$ atoms/cm$^2$; tilt angle: 7 degrees.

Here, it should be noted that as the ion-implantation mask (ND mask) covers the pathway portion 5e and a part of the contact region 5f connected thereto, the part being adjacent to the pathway portion 5e, the length of the pathway portion 5e can be made as short as possible and thus the refinement of a semiconductor device is enhanced.

When the above-described ion-implantation is completed, the ion-implantation mask (ND mask) is removed. Then, an ion-implantation is carried out to form the source/drain regions 19 of the p-type MISFET (refer to FIG. 1) and the p-type body contact region 31 of the n-type MISFET formation region, Rnt, (refer to FIG. 5B) by using an ion-implantation mask (PD mask) having the following mask pattern. That is, the mask pattern has a first mask opening 62a so that the contact portion 5c excluding the area thereof adjacent to the pathway portion 5b is exposed and a second mask opening 62b so that the active region 5d and a part of the pathway portion 5e of the p-type MISFET formation region, Rpt, are exposed. Here, note that the first mask opening 62a of the ion-implantation mask (PD mask) used in this manufacturing step exposes most part of the contact portion 5c of the n-type MISFET formation region, Rnt, but the ion-implantation mask (PD mask) covers the pathway portion 5b and a part of the contact portion 5c connected thereto, the part being adjacent to the pathway portion 5b. In this case, the ion-implantation is carried out under the following one-step ion-implantation conditions: dopant ions: boron fluoride ions; acceleration energy: 5 keV; dose: $2 \times 10^{12}$ toms/cm$^2$; tilt angle: 7 degrees.

Here, it should be noted that as the ion-implantation mask (PD mask) covers the pathway portion 5b and a part of the contact portion 5c connected thereto, the part being adjacent to the pathway portion 5b, the length of the pathway portion 5b can be made as short as possible and thus the finer pattern of a semiconductor device can be achieved.

Figure 6A:
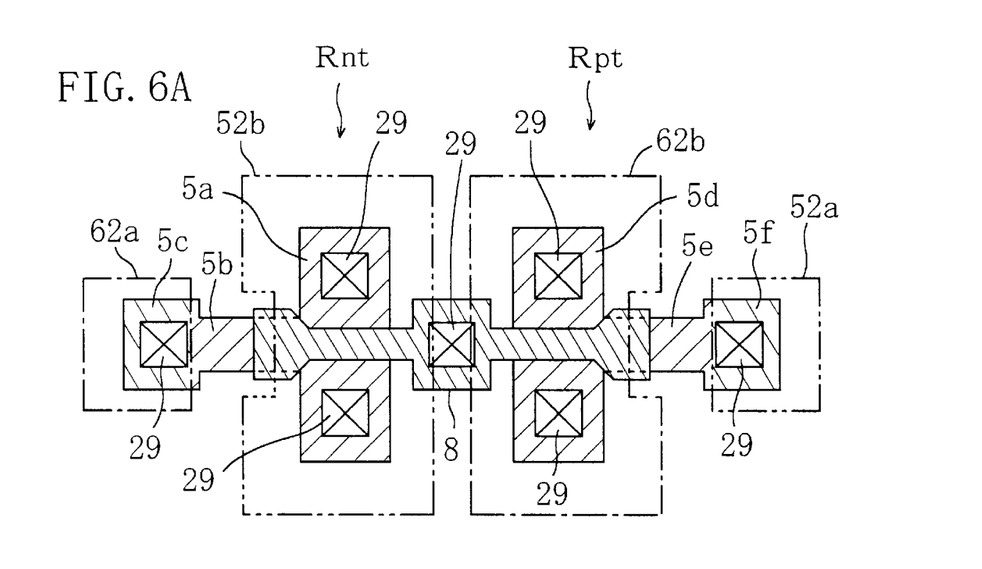
FIGS. 6A and 6B are a plan view and a cross sectional view, respectively, illustrating a wiring formation step out of the whole process steps for manufacturing an SOI device according to the present invention.
Figure 6B:
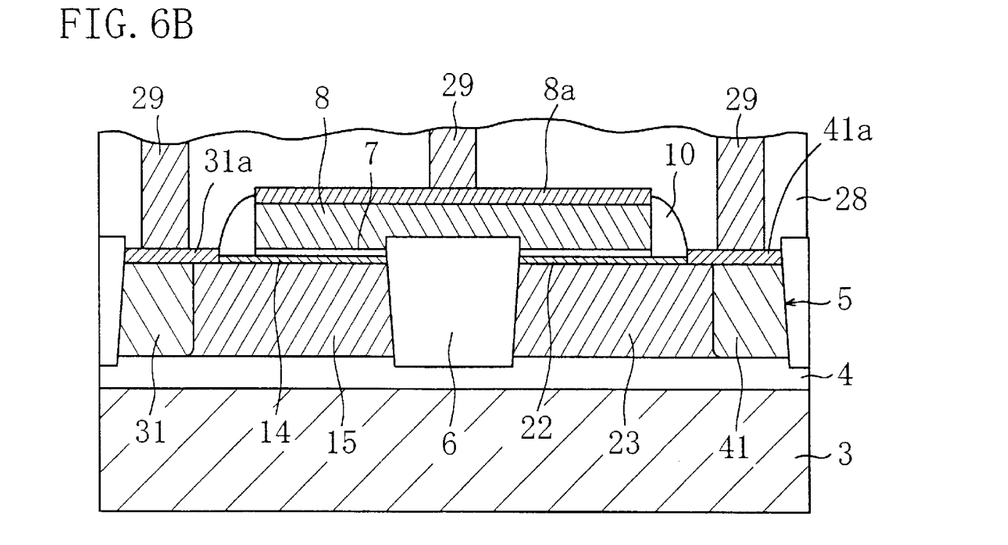

Next, after the ion-implantation mask (PD mask) is removed, in the manufacturing step corresponding to FIGS. 6A and 6B, silicide films 8a, 11a, 19a, 31a, 41a are formed in the upper portions of the respective silicon layers, the upper portions being exposed on the substrate. Furthermore, an interlayer insulating film 28 of a silicon oxide film is formed over the substrate. Subsequently, plugs 29 are formed penetrating the interlayer insulating film 28 and reaching the surfaces of the gate electrode 8, the source/drain regions 11, 19 and the body contact regions 31, 41, respectively.

The inverter circuit formed as described above is configured such that the electrical potential of the well regions 15, 23 immediately below the channel control regions 14, 22 of the respective MISFETs is fixed by applying a voltage to the plugs 29 reaching the body contact regions 31, 41.

According to the manufacturing method of this embodiment, in the manufacturing step (the steps for a pocket ion-implantation and an LDD ion-implantation) shown in FIGS. 4A and 4B, when performing a pocket ion-implantation for the n-type MISFET, an ion-implantation mask (NY mask) covering the contact region 5f of the p-type MISFET is applied, and when performing a pocket ion-implantation for the p-type MISFET, an ion-implantation mask (PY mask) covering the contact region 5c of the n-type MISFET is applied, whereby the impurities of the conductivity type opposite to that of the body contact region are securely prevented from being introduced into the pathway portions 5e, 5b of the respective MISFETs.

Furthermore, as each of the ion-implantation masks (the NY mask and the PY mask) covers the area of the pathway portions 5b, 5e, respectively, which is not covered by the gate electrode 8, impurities of the conductivity type opposite to that of the body contact region are prevented from being introduced into the pathway portions 5b, 5e when performing an LDD ion-implantation, and thus the phenomenon that the capability of the inverter circuit in fixing the electrical potential of the body degrades can be prevented.

Moreover, in the manufacturing step shown in FIGS. 5A and 5B, as the ion-implantation masks (ND mask and PD mask) cover the pathway portions 5e, 5b and a part of the body contact regions connected thereto, the part being adjacent to the corresponding pathway portions, the length of the pathway portion can be made as short as possible and thus the refinement of a semiconductor device is enhanced.

In the above-described embodiment, although the embodiment employs the so-called LDD region as a second source/drain region doped with impurities at a lower concentration than that of a source/drain region, instead of the LDD region, it may employ an extension region doped with impurities at a relatively high concentration as a second source/drain region in the present invention.

While there has been described what are at present considered to be preferred embodiments of the invention, it will be understood that various modifications may be made thereto, and it is intended that the appended claims cover all such modification as fall within the true spirit and scope of the invention.

What is claimed is:

1. A method for manufacturing a semiconductor device, said semiconductor device comprising a first MISFET and a second MISFET:

said first MISFET having:
 a gate electrode formed on a semiconductor layer of an SOI substrate;
 source/drain regions of a first conductivity type formed in both regions beside said gate electrode in said semiconductor layer;
 a well region of a second conductivity type formed below said gate electrode in said semiconductor layer; pocket regions doped with impurities of said second conductivity type at a higher concentration than that of said well region and formed between said well region and said source/drain regions in said semiconductor layer;

a body contact region doped with impurities of said second conductivity type at a higher concentration than that of said well region and connected to said well region;

a pathway portion doped with impurities of said second conductivity type and connecting said well region and said body contact region;

said second MISFET having:

said gate electrode formed on said semiconductor layer of said SOI substrate;

source/drain regions of said second conductivity type formed in both regions beside said gate electrode in said semiconductor layer;

a well region of said first conductivity type formed below said gate electrode in said semiconductor layer;

pocket regions doped with impurities of said first conductivity type at a higher concentration than that of said well region and formed between said well region and said source/drain regions in said semiconductor layer;

a body contact region doped with impurities of said first conductivity type at a higher concentration than that of said well region connected to said well region;

a pathway portion doped with impurities of said first conductivity type and connecting said well region and said body contact region;

said method comprising:

a pocket ion-implantation step for implanting impurity ions of said second conductivity type into said pocket regions of said first MISFET by using a first ion-implantation mask, which has an opening in an active region on said first MISFET and which includes said body contact region of said second MISFET, covering said second MISFET forming region, and implanting impurity ions of said first conductivity type into said pocket regions of said second MISFET by using a second ion-implantation mask, which has an opening in an active region of said second MISFET and which includes said body contact region of said first MISFET, covering said first MISFET forming region.

2. The method for manufacturing a semiconductor device according to claim 1 wherein said gate electrode extends to cover halfway portions of said pathway portions of said corresponding well regions; within said semiconductor layer, each of said first and second MISFETs further comprises second source/drain regions doped with impurities of the same conductivity type as that of said source/drain regions at a lower concentration than that of said source/drain regions and being adjacent to the respective source/drain regions on the respective source/drain regions near the gate electrode; and said first and second ion-implantation masks are also used for implanting impurity ions to form said respective second source/drain regions and covers a part of said respective pathway portions of said well regions, said part being not covered by said gate electrode.

3. The method for manufacturing a semiconductor device according to claim 1, wherein a third ion-implantation mask covering a part of said body contact region of said first MISFET, said part being adjacent to said pathway portion, is applied when impurity ions of said second conductivity type are implanted into said body contact region of said first MISFET, and a fourth ion-implantation mask covering a part of said body contact region of said second MISFET, said part being adjacent to said pathway portion, is applied when impurity ions of said first conductivity type are implanted into said body contact region of said second MISFET.

* * * * *